United States Patent [19]

Szczyrbowski

[11] Patent Number: 5,372,694
[45] Date of Patent: Dec. 13, 1994

[54] TARGET FOR CATHODE SPUTTERING

[75] Inventor: Joachim Szczyrbowski, Goldbach, Germany

[73] Assignee: Leybold Aktiengesellschaft, Hanau, Germany

[21] Appl. No.: 144,297

[22] Filed: Oct. 27, 1993

[30] Foreign Application Priority Data

Dec. 14, 1992 [DE] Germany ............................. 4242079

[51] Int. Cl.5 ............................................. C23C 14/34
[52] U.S. Cl. ..................... 204/298.12; 204/192.12; 204/298.09
[58] Field of Search ...................... 204/298.09, 298.12, 204/192.12

[56] References Cited

U.S. PATENT DOCUMENTS

| 4,200,510 | 4/1980  | O'Connell et al. | 204/298.12 X |
| 4,485,000 | 11/1984 | Kawaguchi et al. | 204/298.12 |
| 4,488,956 | 12/1984 | Scherer et al. | 204/298 |
| 4,747,927 | 5/1988  | Rille et al. | 204/298 |
| 4,966,676 | 10/1990 | Fukasawa et al. | 204/298 |
| 5,039,913 | 8/1991  | Wegmann et al. | 204/298.09 X |
| 5,066,381 | 11/1991 | Ohta et al. | 204/298.12 |
| 5,071,535 | 12/1991 | Hartig et al. | 204/298.12 X |

FOREIGN PATENT DOCUMENTS

| 0393344 | 10/1990 | European Pat. Off. |
| 55-58367 | 5/1980 | Japan . |
| 63-035769 | 2/1988 | Japan . |
| 63-35770 | 2/1988 | Japan . |
| 63-100177 | 5/1988 | Japan . |
| 2209476 | 8/1990 | Japan . |
| 428866 | 1/1992 | Japan . |

Primary Examiner—Nam Nguyen
Attorney, Agent, or Firm—Felfe & Lynch

[57] ABSTRACT

Target tiles formed from the material to be sputtered each have a parallelepipedal configuration and are each soldered, welded or cemented fixedly to a target base plate of similar dimensions, each target base plate being slightly smaller in its length (b) and slightly larger in its width (a) than the corresponding target tile, while the two marginal portions of the target base plates that project in each case beyond the lateral edges of the target tiles are fixed to the cathode body (3) by means of clamping cleats.

6 Claims, 1 Drawing Sheet

TARGET FOR CATHODE SPUTTERING

BACKGROUND OF THE INVENTION

The invention relates to a target for a cathode disposed in an evacuable process chamber which can be flooded with a process gas in an apparatus for coating workpieces. A plurality of target tiles are disposed end to end on the cathode body and together form the target. At least one target base plate is disposed between the target tiles and the cathode body.

In sputtering processes fragile materials are often used as the target. Such materials include, for example, silicon (Si) and indium tin oxide (ITO).

Especially in the glass coating industry, sputtering apparatus with magnetron cathodes of up to 4000 mm in length are used. The material to be deposited is fastened in the form of a plane-parallel plate composed of one or more pieces onto a target base plate. During the sputtering process a predominant part of the power supplied to the cathode is given off as heat. In order to assure a sputtering process of enduring stability the target material has to be intensively cooled.

A bonded target of a fragile material is indirectly cooled. The heat produced is removed through the water-cooled target base plate. To assure good cooling the target material must have a good thermal contact with the base plate and the base plate must have a high thermal conductivity.

In the case of delicate materials, good thermal contact can be achieved only by cementing or soldering the target material to the base plate. Tight clamping (with edge cleats) is impossible on account of the fragility of the target. Copper has very good thermal conductivity and is furthermore inexpensive, and therefore target base plates are often made of copper. In high-power sputtering, temperature differences can occur between the target surface of the target assembly and the target base plate amounting to more than 100° C. Since the base plate and the target consist of different materials with different coefficients of expansion, a very high tension develops at the target and base plate interface. This very often results in the deformation and in the separation of the target material from the base plate. To prevent this in the case of a large-area coating cathode the target material must be composed of several pieces and have a very good and heat-resistant adhesion to the base plate.

In practice a silicon or ITO target is composed of a plurality of tiles. These tiles are cemented or soldered onto a copper plate of the size of the cathode.

Preparing a large target (e.g., over 2 meters long) by cementing is extraordinarily time-consuming and difficult. To permit good adhesion, the cement is cured in practice at a high temperature (up to 180° C.). When the finished target cools to room temperature, enormous tensions occur between the copper base plate and the target material due to the different expansion coefficients. To prevent deformation of the finished target and the destruction of the silicon tiles, certain gaps must be left between the individual silicon tiles. Upon cooling, the tiles run together and the gaps become narrower. At the high temperature, if the gaps are set too close or partially filled with cement residues, the tiles are pressed against one another with enormous force, resulting in the destruction of the target material during the sputtering process. If the gaps are set too wide, empty gaps are left between individual target parts after cooling, which leads to instability (arcing) in the sputtering process, so that the gaps between the individual tiles must be set with extraordinary accuracy, and the cement residues must be entirely removed from the gaps.

In order to prevent destruction of the entire target by deformation during transport and installation, the target base plate has to have some rigidity. This is provided by an appropriate thickness of the target base plate (6–10 mm) depending on the target length.

Soldered targets have as a rule very good thermal contact and strong adhesion of the material to the base plate. The soldering procedure is similar to cementing, although the target material in this case must be especially prepared. First one or more metal coatings are deposited on the bonding surface of the target to assure a tight join between the solder and the target material. The soldering is performed at a temperature above 100° C. The problems involved in the cooling of the target are the same as those which occur in cementing.

SUMMARY OF THE INVENTION

The present invention is addressed to creating a target from fragile materials, such as Si or ITO, for large magnetron cathodes, in which the gaps between the individual target pieces will be reduced to a minimum, in which target change will be especially easy to perform, and in which the danger of damaging the targets during transport and during target replacement will be minimized. Furthermore the outgassing of cement residues during the sputtering process is to be prevented.

According to the invention, the target tiles formed from the material to be sputtered each have a parallelepipedal configuration and are each soldered, welded or cemented to a respective target base plate of similar dimensions. The target base plates are slightly smaller in length and slightly greater in width than the corresponding target tile, the two marginal portions of the target base plates projecting in width beyond the margin of the target tile. The plates are held tightly on the cathode body by means of cleats.

DETAILED DESCRIPTION OF THE PREFERRED EMBODIMENT

Figure 1:
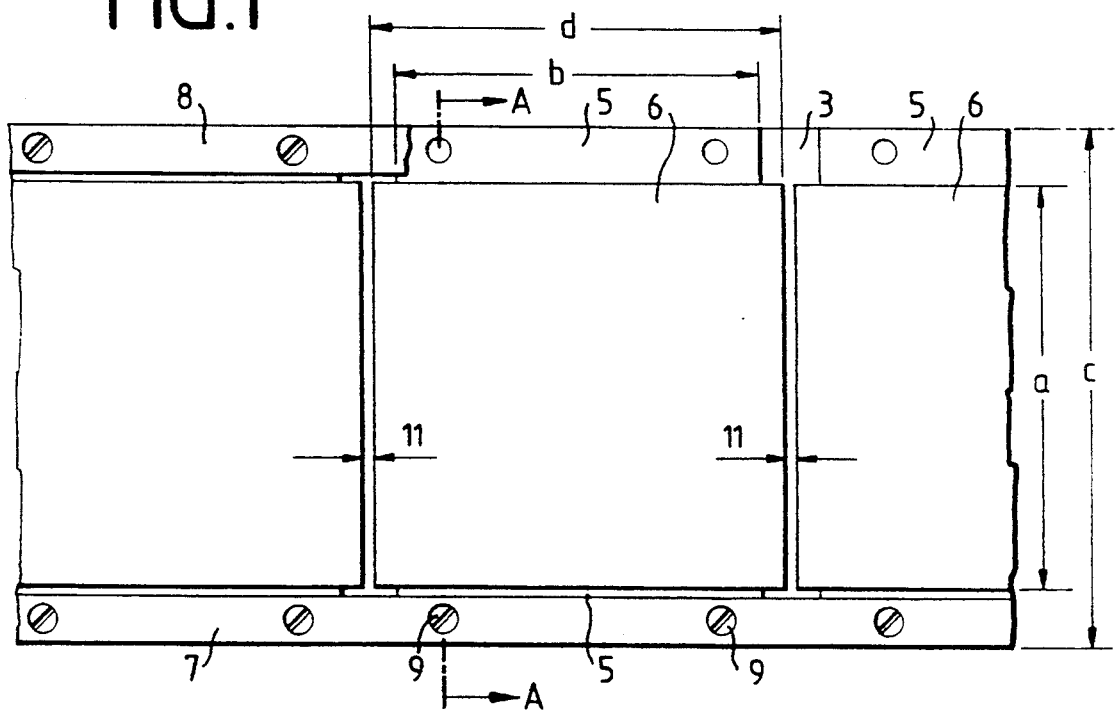
FIG. 1 is a plan view of the target assembly.

The cathode consists essentially of a trough-like cathode body 3, the cooling diaphragm 4 soldered thereto, the target base plates 5, the target tiles 6, cemented or soldered to the latter, and the two cleats 7 and 8 screwed to the cathode body 3.

Figure 2:
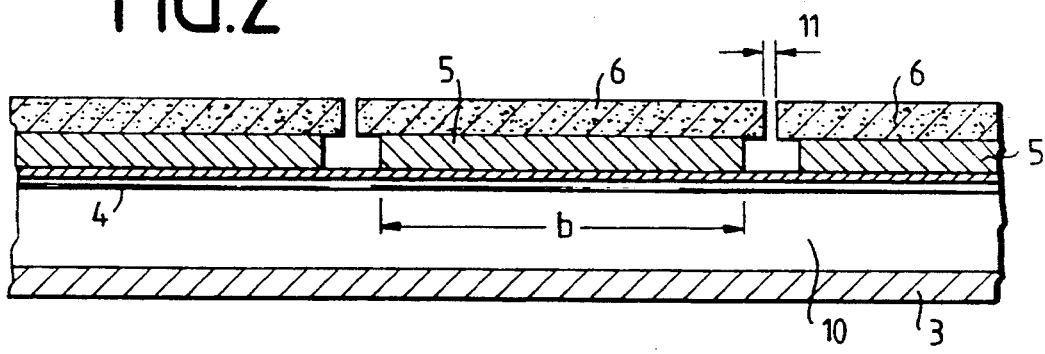
FIG. 2 is a side section of the target assembly.

As can be seen in FIGS. 1 and 2, the target tiles 6 and the target base plates 5 are rectangular in plan, the width c of the target base plates 5 being greater than the length b of the target base plates 5, the width a of the target tiles 6 being shorter than the width c of the target plate 5, and the length d of the target tiles 6 being longer the length b of the target plates 5.

Figure 3:
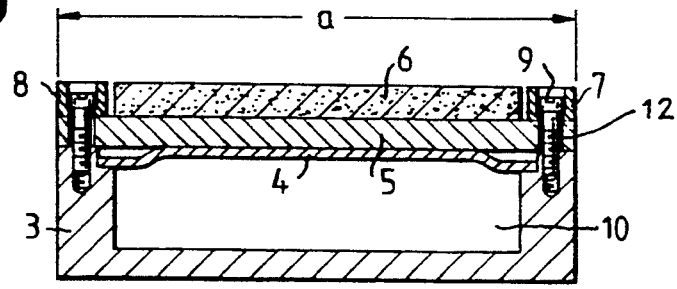
FIG. 3 is an end section of the target assembly taken along the line A—A of FIG. 1.

Referring to FIG. 3, the marginal portions of the target base plates 5 projecting beyond the target tile 6 are fastened to the cathode body 3 by means of screws 9 and two cleats 7, 8 whose total length corresponds to the total length of the trough-like cathode body 3. The bottom of the target base plates 5 is in tight contact with the upper side of the metal diaphragm 4, to assure good thermal transfer between the cooling liquid flowing through channel 10 and the target base plates 5, and thus also the target tiles 6.

The gaps 11 between the adjacent target tiles 6 are of such a size that the shock and pressure sensitive target tiles 6 cannot come in contact with one another upon heating to the working temperature. Where the temperature coefficient at expansion of the target material is zero or negative, the tiles 6 may abut.

The individual target tiles 6 are cemented or soldered onto the individual target base plates 5 at elevated temperature. After the cement or solder has fully hardened, these target tiles are cooled to room temperature. After that the plates 5 are fastened onto the cathode body 3 close together, without any or with a very small gap 11 between the adjacent tiles 6. Shifting of the target tiles lengthwise of the cathode body 3 remains possible by virtue of the clearance between bores 12 in the base plates 5, and the screws 9 received therethrough (FIG. 3). This possibility of shifting can compensate for possible strains that may develop as a result of thermal expansion.

It is especially advantageous that the individual target base plates 5 are each shorter than the target tiles 6. Thus, even if the target tiles 6 are not cemented or soldered perfectly parallel to the lateral surfaces of the base plates 5, the distance 11 between adjacent target tiles can be made almost zero.

The trough-shaped cathode body 3, whose upper margin facing the target tiles 6 is welded or soldered to the diaphragm 4, has connections (not shown) by which it is inserted into a cooling water circuit, so that the bottom of the diaphragm 4 is always exposed to the flowing coolant during the coating process, while the pressure in the cooling circuit assures that the diaphragm 4 has its top side in good contact with the bottom of the target base plates 5 arranged in a line, and thus also provides for good cooling of the target tiles 6.

The gap 11 between the individual target tiles 6 and the length b of the target base plates 5 and the set-back confronting end faces of the target base plates 5 bring it about that any outgassing solder or cement residues will not result in undesired reactions in the area of the seams or gaps 11 so that the edges forming the gaps 11 are not eroded or undesirably ablated during the sputtering process.

Copper can be used as the material for the target base plates 5. In order to further dissipate strains between target material and base plate, resulting from the different expansion coefficients (for copper $\alpha = 16.6 \times 10^{-6\circ}$ C. and for silicon $\alpha = 3.5 \times 10^{-6\circ}$ C.), copper can be replaced by molybdenum ($\alpha = 5 \times 10^{-6\circ}$ C.). The cost of molybdenum, however, is substantially greater than the cost of copper, so that molybdenum is recommendable only if it appears desirable for technical reasons.

The advantages of the invention are:

The gap between the individual target tiles 6 is reduced virtually to zero and thus the stability of the process is improved.

The time-consuming and costly procedure of maintaining the space between adjacent target tiles and the removal of cement or solder from the gaps 11 between the target tiles 6 before the target cools is eliminated.

The danger of the destruction of the individual tiles by strains between adjacent target tiles 6 during the cooling procedure no longer exists.

The target base plates 5 can be made especially thin.

The production of stock target tiles 6 becomes possible.

The transportation and storage of targets is easier. Individual target tiles can be packaged in smaller cases.

The danger of damage to a target in transport is low. (The deformation of a short plate (100 mm) with soldered or cemented target material is substantially less than the deformation of a 3750 mm long target, for example.)

The installation of the target in the process chamber is simplified.

I claim:

1. Cathode sputtering apparatus comprising
   a cathode,
   a plurality of target tiles, each target tile having a pair of opposed ends and a pair of opposed lateral edges,
   a plurality of target base plates to which respective said target tiles are fixed, each base plate having a pair of opposed ends beyond which respective ends of said target tiles extend and a pair of opposed marginal portions which extend beyond respective lateral edges of said target tiles, and
   fixing means for fixing said marginal portions of said base plate to said cathode so that each end of each said target tile is adjacent to an end of another said target tile.

2. Cathode sputtering apparatus as in claim 1 wherein said fixing means comprises at least one hole through each said marginal portion of said base plate and a screw extending through each said hole.

3. Cathode sputtering apparatus as in claim 2 wherein said fixing means further comprises clamping means held against each said marginal portion of said base plate by said screws.

4. Cathode sputtering apparatus as in claim 3 wherein said screws are received through each said hole with clearance, thereby permitting shifting of said base plates.

5. Cathode sputtering apparatus as in claim 1 wherein each end of each said target tile is spaced from the adjacent end of another target tile by a gap.

6. Cathode sputtering apparatus as in claim 1 wherein said cathode has a cooling channel therein, said apparatus further comprising a diaphragm fixed to said cathode between said cooling channel and said base plates.

* * * * *